(12) United States Patent
Oh

(10) Patent No.: US 8,461,609 B2
(45) Date of Patent: Jun. 11, 2013

(54) LIGHT EMITTING DEVICE PACKAGE

(75) Inventor: Nam Seok Oh, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 48 days.

(21) Appl. No.: 13/110,962

(22) Filed: May 19, 2011

(65) Prior Publication Data
US 2011/0291137 A1 Dec. 1, 2011

(30) Foreign Application Priority Data
May 26, 2010 (KR) .......................... 10-2010-0049065

(51) Int. Cl.
*H01L 33/00* (2010.01)
*F21V 9/00* (2006.01)

(52) U.S. Cl.
USPC .......... 257/98; 257/99; 257/E33.068; 362/231

(58) Field of Classification Search
USPC .............. 257/98, 99, E33.068; 362/231, 260, 362/293
See application file for complete search history.

(56) References Cited

U.S. PATENT DOCUMENTS

| | | | |
|---|---|---|---|
| 5,813,753 A | 9/1998 | Vriens et al. | |
| 6,155,699 A | 12/2000 | Miller et al. | |
| 6,833,565 B2 * | 12/2004 | Su et al. | 257/98 |
| 2004/0105481 A1 | 6/2004 | Ishida et al. | |
| 2008/0123339 A1 * | 5/2008 | Bierhuizen et al. | 362/293 |
| 2009/0001399 A1 | 1/2009 | Diana et al. | |
| 2009/0134412 A1 | 5/2009 | Shylo et al. | |

FOREIGN PATENT DOCUMENTS

| | | |
|---|---|---|
| JP | 2008-235827 | 10/2008 |
| KR | 10-0593935 | 6/2006 |
| KR | 10-0726970 | 6/2007 |
| KR | 10-0772648 | 10/2007 |
| KR | 10-2009-0000470 | 1/2009 |
| KR | 10-2009-0026689 | 3/2009 |
| WO | WO 2008/092437 | 8/2008 |

OTHER PUBLICATIONS

European Search Report issued in EP Application No. 11167271.3 dated Sep. 6, 2011.
Korean Office Action issued in KR Application No. 10-2010-0049065 dated Feb. 11, 2011.

* cited by examiner

*Primary Examiner* — Nikolay Yushin
(74) *Attorney, Agent, or Firm* — KED & Associates, LLP

(57) ABSTRACT

A light emitting device package is provided. The light emitting device package may include a housing including a cavity, a light emitting device disposed within the cavity, a filler filled in the cavity in order to seal the light emitting device, a fluorescent layer disposed on the filler, and an optical filter being disposed within the filler and transmitting light with a particular wavelength.

18 Claims, 3 Drawing Sheets

LIGHT EMITTING DEVICE PACKAGE

CROSS-REFERENCE TO RELATED APPLICATION(S)

This application claims priority under 35 U.S.C. §119 to Korean Application No. 2010/49065 filed in Korea on May 26, 2010, whose entire disclosure(s) is/are hereby incorporated by reference.

BACKGROUND

1. Field

This relates to a light emitting device package.

2. Background

Group III-V nitride semiconductors may be used as a core material of a light emitting device such as, for example, a light emitting diode (LED) of a laser diode (LD) and the like. A group III-V nitride semiconductor may include a semiconductor material having a chemical formula of, for example, $In_xAl_yGa_{1-x-y}N$ ($0 \leq x \leq 1$, $0 \leq y \leq 1$, $0 \leq x+y \leq 1$). An LED converts electricity into infrared rays or light using characteristics of a compound semiconductor. A nitride semiconductor material in such a light emitting device may be applied to light sources of various products, such as, for example, a keypad, an electric sign, a lighting device and other such devices employing a light source.

BRIEF DESCRIPTION OF THE DRAWINGS

The embodiments will be described in detail with reference to the following drawings in which like reference numerals refer to like elements wherein.

DETAILED DESCRIPTION

Figure 1:
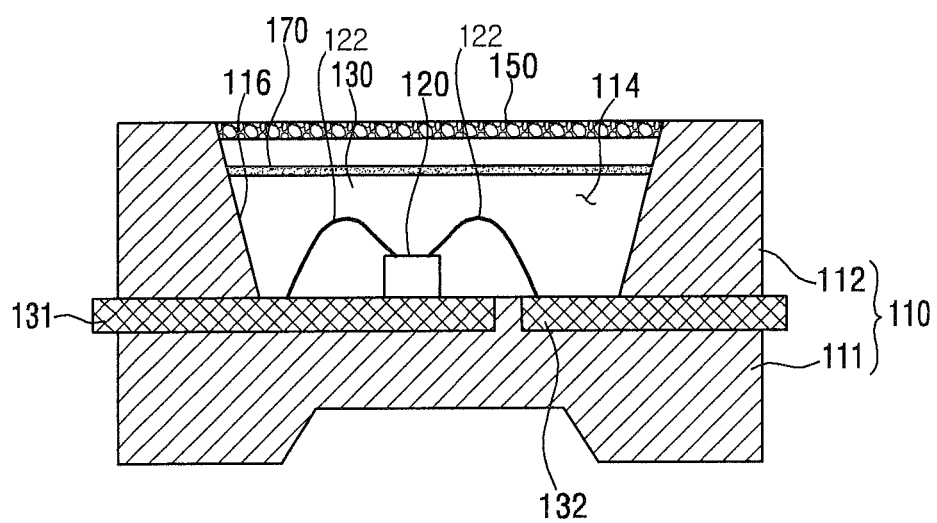
FIG. 1 is a cross sectional view of a light emitting device package in accordance with an embodiment as broadly described herein.

In the drawings, a thickness or size of each layer may be magnified, omitted or schematically shown for the purpose of convenience and clarity. The size of each component as shown in the drawings does not necessarily represent its actual size. It will be understood that when an element is referred to as being 'on' or "under" another element, it may be directly on/under the element, or one or more intervening elements may also be present. When an element is referred to as being 'on' or 'under', 'under the element' as well as 'on the element' may be included based on the element.

As shown in FIG. 1, a light emitting device package 100 as embodied and broadly described herein may include a housing 110 having a cavity 114 formed therein, a light emitting device 120 provided in the cavity 114, a filler 130 filled in the cavity 114, a fluorescent layer 150 and an optical filter 170.

The housing 110 may include, for example, PCB, a ceramic substrate and/or a resin material. In the embodiment shown in FIG. 1, the housing 110 may be made of, for example, Polyphthalamide (PPA). The housing 110 may include a lower housing 111 and an upper housing 112. As shown in FIG. 1, the lower housing 111 and the upper housing 112 may be integrally injection-molded with a first lead frame 131 and a second lead frame 132. In alternative embodiments, the housing 112 may be stacked and coupled on the lower housing 111 and the first and the second lead frames 131 and 132.

The first and the second lead frames 131 and 132 may penetrate the housing 110 so that they are partially inside the cavity 114 of the housing 110 and partially outside the housing 110. The embodiment shown in FIG. 1 includes first and second lead frames 131 and 132. However, in alternative embodiments, three or more lead frames may be provided based on the design of a particular light emitting device package. The first and the second lead frames 131 and 132 shown in FIG. 1 may be electrically connected to the light emitting device 120 so as to supply electric power to the light emitting device 120.

The cavity 114 of the housing 110 as viewed from the top thereof may have a variety of shapes, such as, for example, a circle or a polygon. A circumferential surface 116 that defines a periphery of the cavity 114 may be vertical or inclined with respect to the top surface of the lower housing 111.

The light emitting device 120 may be provided within the cavity 114 and may be placed on the first lead frame 131 or the second lead frame 132. The light emitting device 120 may be electrically connected to the first lead frame 131 and/or the second lead frame 132 by one or more wires 122.

In alternative embodiments, the light emitting device 120 may be electrically connected to the first lead frame 131 and the second lead frame 132 in various different ways, such as, for example, by a flip-bonding method without a wire, or may be electrically connected to the second lead frame 132 by a die-bonding process and electrically connected to the first lead frame 131 by a wire.

In a vertical type light emitting device package, the light emitting device 120 may be directly electrically connected to the second lead frame 132 and may be electrically connected to the first lead frame 131 by the wire 122. Alternatively, the light emitting device 120 may be directly electrically connected to the first lead frame 131 and may be electrically connected to the second lead frame 132 by the wire.

The light emitting device 120 may be provided within the cavity 114 or may be provided on the housing 110. The light emitting device 120 may be provided on a lead frame other than the first lead frame 131 and the second lead frame 132 shown in FIG. 1.

In the embodiment shown in FIG. 1, the light emitting device 120 may include a light emitting diode chip emitting blue light, green light, UV light or other type of light as appropriate. Simply for purposes of discussion, the structure and function of the exemplary embodiment shown in FIGS. 1-3 will be described with respect to a light emitting diode chip that emits blue light.

The filler 130 filled in the cavity 114 may be made of an optical transmitting resin such as, for example, a silicone resin, an epoxy resin, or other material as appropriate.

The fluorescent layer 150 may be provided on the filler 130. The fluorescent layer 150 may include, for example, a yellow fluorescent material, to appropriately interact with the blue light emitted by the light emitting device 120 to ultimately produce white light. A YAG based fluorescent material, a TAG based fluorescent material, a silicate based fluorescent material, a garnet based fluorescent material, an oxide based fluorescent material and/or a nitride based fluorescent material may be selectively used as the yellow fluorescent substance. Other types of yellow fluorescent substances may also be appropriate.

The optical filter 170 may be provided within the filler 130. The optical filter 170 may transmit light having a particular wavelength and may reflect light having a wavelength other than the particular wavelength.

The light having the particular wavelength may be determined based on the wavelength of light emitted by the light emitting device which is provided within the cavity and functions as a light source. For example, if the light emitting device 120 includes a light emitting diode which emits blue light having a wavelength of, for example 420 nm to 470 nm, the particular wavelength of the light may be equal to the wavelength of light emitted by the blue light emitting diode. In certain embodiments, the light emitting device 120 including such a blue light emitting diode may emit blue light having a wavelength of approximately 445 nm to 455 nm, with the particular wavelength transmitted by the optical filter 170 corresponding thereto. The optical filter 170 may include a material for transmitting light having such a wavelength.

In certain embodiments, the optical filter 170 may have a flat shape. In alternative embodiments, the optical filter 170 may have a convex shape or a concave shape with respect to the fluorescent layer 150.

Figure 2:
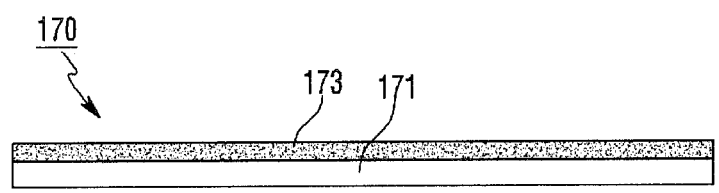
FIG. 2 is a side view of an optical filter of the light emitting device package shown in FIG. 1.

As shown in FIG. 2, the optical filter 170 may include a transparent base film 171 and a filter 173 provided on the transparent base film 171. The filter 173 may include a dielectric layer or a metal layer, and the dielectric layer or the metal layer may include a plurality of layers, thereby increasing the reflectance of light having a particular wavelength. The transparent base film 171 of the optical filter 170 may be provided on both sides of the filter 173.

The plurality of layers of the dielectric layer may be deposited on the transparent base film 171. The dielectric material of the dielectric layer may include, for example, $TiO_2$ or $SiO_2$. The metal layer may also be deposited on the transparent base film 171. The metallic material of the metal layer may include, for example, Ag or Al.

Figure 3:
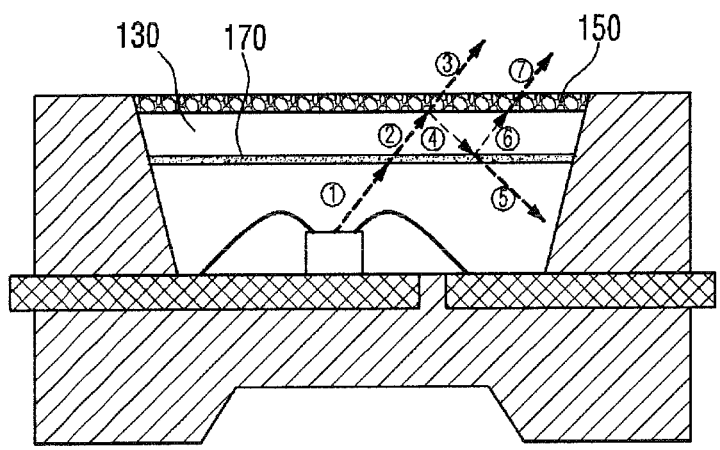
FIG. 3 illustrates a path of light emitted by the light emitting device in the light emitting device package shown in FIG. 1.

As shown in FIG. 3, first, blue light may be emitted by the blue light emitting device 120 disposed within the filler 130 (1). The blue light passes through the optical filter 170 disposed within the filler 130 and is incident on the fluorescent layer 150 (2) because the optical filter 170 includes a material capable of transmitting light having a wavelength equal to the wavelength of the light emitted by the light emitting device 120. For example, if the light emitting device 120 emits blue light having a wavelength of 450 nm, the optical filter 170 includes a material capable of transmitting light having a wavelength of 450 nm.

If the light emitting device 120 emits blue light, then the fluorescent layer 150 may include a yellow fluorescent material. The blue light emitted by the blue light emitting device 120 passes through the yellow fluorescent material, and is emitted as white to the outside (3). However, all the white light generated after the blue light, which has passed through the filler 130, is incident on the fluorescent layer 150, is not necessarily emitted to the outside. A part of the white light is reflected by the surface of the fluorescent layer 150 and is incident within the filler 130 (4).

A part of the white light which has been incident within the filler 130, which has a blue wavelength, penetrates the optical filter 170 (5). The remaining yellowish white light is reflected again by the optical filter 170 (6) and is emitted to the outside through the fluorescent layer 150 (7). Even though the yellowish white light reflected again by the optical filter 170 may slightly change the color of the white light as originally intended, the amount of yellowish white (7) is not great compared to the amount of white light initially emitted to the outside (3) from the fluorescent layer 150. Therefore, the yellowish white light does not generate an appreciable change in the overall color of the white light emitted by the light emitting device package 100.

The optical filter 170 provided within the filler 130 reflects again the light reflected by the fluorescent layer 150, so that a luminous efficiency of the light emitting device package 100 may be improved by including the optical filter 170 within the filler 130.

That is, if no optical filter 170 were provided within the filler 130, the blue light emitted by the blue light emitting device 120 would excite the yellow fluorescent material included in the fluorescent layer 150 and emit the white light to the outside (3). Again, a part of the white light is reflected by the fluorescent layer 150 and is incident within the filler 130. In this arrangement, without the optical filter, the white light that is incident within the filler 130 would be absorbed into either the light emitting device disposed within the cavity or a lead frame disposed on the housing. Therefore, optical loss would occur and luminous efficiency would be reduced.

In the embodiment shown in FIGS. 1-3, in order to describe the path of light emitted by the light emitting device, a blue light emitting device has been provided as an example of the light emitting device. However, the light emitting device may include any light emitting device capable of creating colors such as, for example, red or green, and may be used to describe the path of light in a similar manner.

Further, as described above, considering both a re-reflectance of the white light by the optical filter and luminous efficiency based on the optical path during the emission of blue light from the blue light emitting device, the optical filter may have a thickness of, for example, from 3 μm to 5 μm. Other thicknesses may also be appropriate, based on the relative size of related components and emission characteristics of a particular device.

Figure 4:
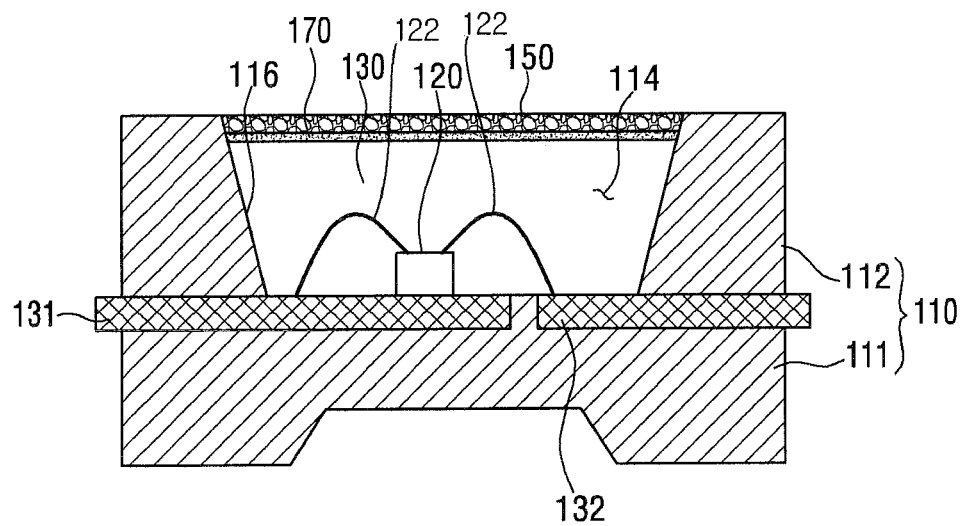
FIG. 4 is a cross sectional view of a light emitting device package in accordance with another embodiment as broadly described herein.

FIG. 4 is a cross sectional view of a light emitting device package in accordance with another embodiment as broadly described herein. The light emitting device package 200 may include a housing 110 having a cavity 114 formed therein, a light emitting device 120 provided in the cavity 114, a filler 130 filled in the cavity 114, a fluorescent layer 150 and an optical filter 170. In this embodiment, the optical filter 170 is positioned on the filler 130, and not embedded within the filler 130. The fluorescent layer 150 is positioned directly on the optical filter 170.

Figure 5:
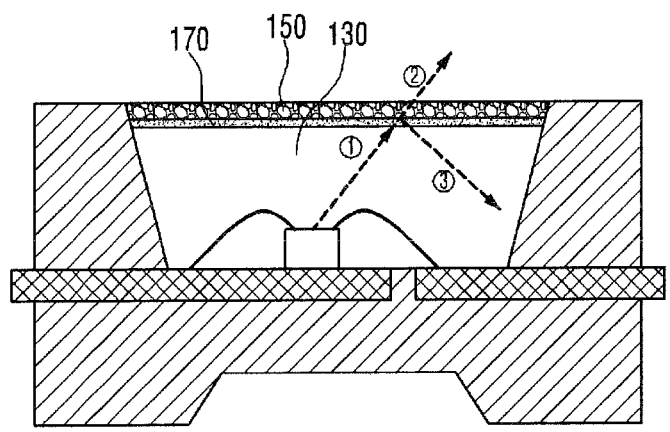
FIG. 5 illustrates a path of light emitted by the light emitting device in the light emitting device package shown in FIG. 4.

As shown in FIG. 5, first, blue light is emitted by a blue light emitting device 120 provided within the filler 130. The blue light passes through the filler 130 and is incident on the optical filter 170 positioned under the fluorescent layer 150 (1). The blue light which has passed through the optical filter 170 passes through the fluorescent layer 150, where it is transformed into white light and is emitted to the outside (2). In this case, a part of the white light is reflected by the surface of the fluorescent layer 150 and is incident within the filler 130 through the optical filter 170 (3). In this embodiment, unlike the embodiment shown in FIGS. 1 and 3, the fluorescent layer 150 and the optical filter 170 are arranged so as to contact each other, so that the length of the optical path of the white light reflected by the fluorescent layer 150 is reduced. Therefore, yellowish white light is directly emitted to the outside, together with the white light, and luminous efficiency may be further improved.

The embodiments described above are exemplary and may be changed and/or modified in various ways, without departing from the essential features as broadly described herein, and may be readily applied to other types of apparatuses. The description of the foregoing embodiments is intended to be illustrative, and many alternatives, modifications, and variations may be apparent to those skilled in the art. In the claims, any means-plus-function clauses are intended to cover the structures described herein as performing the recited function and not only structural equivalents but also equivalent structures.

A light emitting device package as embodied and broadly described herein may include a housing including a cavity, a light emitting device disposed within the cavity, a filler filled in the cavity in order to seal the light emitting device, a fluorescent layer disposed on the filler, and an optical filter being disposed within the filler and transmitting light with a particular wavelength.

A light emitting device package in accordance with another embodiment as broadly described herein may include a housing including a cavity, a light emitting device disposed within the cavity, a filler filled in the cavity in order to seal the light emitting device, an optical filter being disposed on the filler and transmitting light with a particular wavelength, and a fluorescent layer disposed on the optical filter.

A light emitting device package in accordance with another embodiment as broadly described herein may include a light emitting device disposed within the cavity, a filler filled in the cavity in order to seal the light emitting device, an optical filter disposed on the filler in order to transmit light with a wavelength equal to the wavelength of light emitted from the light emitting device, and a fluorescent layer disposed on the optical filter.

Any reference in this specification to "one embodiment," "an embodiment," "example embodiment," etc., means that a particular feature, structure, or characteristic described in connection with the embodiment is included in at least one embodiment as broadly described herein. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package, comprising:
a housing having a cavity formed therein;
a light emitting device provided within the cavity;
a filler filled in the cavity and covering the light emitting device;
a fluorescent layer coupled to a surface of the filler; and
an optical filter positioned between the light emitting device and the fluorescent layer, the optical filter transmitting light having a predetermined wavelength, wherein the optical filter is embedded within the filler such that the filler is provided between the optical filter and the light emitting device, and also between the optical filter and the fluorescent layer, and wherein the fluorescent layer is directly positioned on a top surface of the filler.

2. The light emitting device package of claim 1, wherein a thickness of the optical filter is between approximately 3 μm and 5 μm.

3. The light emitting device package of claim 1, wherein the optical filter includes a plurality of dielectric layers or a plurality of metal layers.

4. The light emitting device package of claim 1, wherein the filler is made of an optical transmitting resin.

5. The light emitting device package of claim 1, wherein the light emitting device is configured to emit light having a wavelength corresponding to blue light, and wherein the fluorescent layer transmits a first portion of the light emitted by the light emitting device and passed through the filler and the optical filter, and reflects a second portion of the light emitted by the light emitting device.

6. The light emitting device package of claim 5, wherein the optical filter reflects a portion of the second portion of light and the fluorescent layer transmits the portion of light reflected by the optical filter.

7. The light emitting device package of claim 1, wherein the light emitting device emits blue light, and wherein the predetermined wavelength of light transmitted by the optical filter is approximately 450 nm.

8. The light emitting device package of claim 7, wherein the fluorescent layer includes a yellow fluorescent material.

9. A light emitting device package, comprising:
a housing having a cavity formed therein;
a light emitting device provided within the cavity;
a filler provided in the cavity and over the light emitting device;
an optical filter being positioned on a top surface of the filler so as to transmit light having a predetermined wavelength; and
a fluorescent layer positioned on the optical filter, wherein the optical filter is embedded within the filler such that the filler is provided between the optical filter and the light emitting device, and also between the optical filter and the fluorescent layer, and wherein the fluorescent layer is directly positioned on a top surface of the filler.

10. The light emitting device package of claim 9, wherein the optical filter includes a dielectric material or a metallic material.

11. The light emitting device package of claim 9, wherein the optical filter is positioned substantially parallel to the fluorescent layer.

12. The light emitting device package of claim 9, wherein a thickness of the optical filter is between approximately 3 μm and 5 μm.

13. The light emitting device package of claim 9, wherein the optical filter includes a plurality of dielectric layers or a plurality of metal layers.

14. The light emitting device package of claim 9, wherein the predetermined wavelength of light transmitted by the optical filter is approximately 450 nm.

15. The light emitting device package of claim 14, wherein the fluorescent layer includes a yellow fluorescent material.

16. A light emitting device package, comprising:
a light emitting device installed within a cavity, wherein the light emitting device emits light having a predetermined wavelength;
a filler filled in the cavity so as to seal the light emitting device;

an optical filter provided on the filler, wherein the optical filter transmits light having a wavelength equal to the predetermined wavelength of light emitted by the light emitting device; and a fluorescent layer provided on the optical filter, wherein the optical filter is embedded within the filler such that the filler is provided between the optical filter and the light emitting device, and also between the optical filter and the fluorescent layer, and wherein the fluorescent layer is directly positioned on a top surface of the filler.

17. The light emitting device package of claim 16, wherein the optical filter transmits light having a wavelength of approximately 450 nm and the fluorescent layer includes a yellow fluorescent material.

18. The light emitting device package of claim 16, wherein a thickness of the optical filter is between approximately 3 μm and 5 μm.

* * * * *